(12) United States Patent
Chung

(10) Patent No.: US 7,920,109 B2
(45) Date of Patent: Apr. 5, 2011

(54) EMISSION DRIVING DEVICE OF ORGANIC LIGHT EMITTING DISPLAY DEVICE

(75) Inventor: Bo-Yong Chung, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 949 days.

(21) Appl. No.: 11/509,435

(22) Filed: Aug. 23, 2006

(65) Prior Publication Data
US 2007/0046608 A1    Mar. 1, 2007

(30) Foreign Application Priority Data

Aug. 26, 2005  (KR) .................. 10-2005-0078923

(51) Int. Cl.
*G09G 3/32* (2006.01)
*H04N 5/70* (2006.01)
(52) U.S. Cl. .......................... 345/82; 348/801
(58) Field of Classification Search .................. None
See application file for complete search history.

(56) References Cited

U.S. PATENT DOCUMENTS

| | | | | |
|---|---|---|---|---|
| 5,381,455 | A * | 1/1995 | Ovens et al. ................ | 377/67 |
| 6,295,046 | B1 * | 9/2001 | Hebiguchi ................... | 345/100 |
| 6,312,995 | B1 * | 11/2001 | Yu ............................... | 438/283 |
| 6,690,347 | B2 * | 2/2004 | Jeon et al. ................... | 345/100 |
| 6,958,750 | B2 * | 10/2005 | Azami et al. ................ | 345/204 |
| 6,970,530 | B1 * | 11/2005 | Wang et al. ................. | 377/69 |
| 7,203,264 | B2 * | 4/2007 | Lo et al. ...................... | 377/64 |
| 7,256,775 | B2 * | 8/2007 | Eom ............................ | 345/204 |
| 7,286,627 | B2 * | 10/2007 | Tsai et al. .................... | 377/64 |
| 7,289,594 | B2 * | 10/2007 | Moon .......................... | 377/68 |
| 7,406,147 | B2 * | 7/2008 | Lo et al. ...................... | 377/64 |
| 7,425,937 | B2 * | 9/2008 | Inukai ......................... | 345/76 |
| 7,522,145 | B2 * | 4/2009 | Lee et al. .................... | 345/100 |
| 7,532,701 | B2 * | 5/2009 | Moon .......................... | 377/68 |
| 7,545,351 | B2 * | 6/2009 | Shin ............................ | 345/82 |
| 2003/0206608 | A1 * | 11/2003 | Kawahata et al. ........... | 377/64 |
| 2004/0046719 | A1 | 3/2004 | Wang et al. | |
| 2004/0080474 | A1 * | 4/2004 | Kimura ........................ | 345/82 |

(Continued)

FOREIGN PATENT DOCUMENTS

JP         2004-177532        6/2004

(Continued)

OTHER PUBLICATIONS

Patent Abstracts of Japan, Publication No. 2004-177532, dated Jun. 24, 2004, in the name of Shigeki Okuya.

(Continued)

*Primary Examiner* — Bipin Shalwala
*Assistant Examiner* — Daniel Bedell
(74) *Attorney, Agent, or Firm* — Christie, Parker & Hale, LLP

(57) ABSTRACT

A system on panel (SOP)-type emission driving device of an organic light emitting display device. The emission driving device includes an odd emission control line controller having a plurality of flip-flops for outputting emission control signals to odd emission control lines, and an even line controller having a plurality of flip-flops for outputting emission control signals to even emission control lines. Each of the flip-flops alternately receives a clock signal and an inverted clock signal for causing the flip-flip to output an emission control signal. In one embodiment, each flip-flop includes nine PMOS transistors and two capacitors.

14 Claims, 5 Drawing Sheets

U.S. PATENT DOCUMENTS

| | | | |
|---|---|---|---|
| 2005/0052377 A1* | 3/2005 | Hsueh | 345/82 |
| 2005/0104875 A1* | 5/2005 | Kwak et al. | 345/204 |
| 2005/0156833 A1* | 7/2005 | Koyama | 345/76 |
| 2005/0168490 A1* | 8/2005 | Takahara | 345/690 |
| 2005/0220263 A1* | 10/2005 | Moon | 377/68 |
| 2005/0253791 A1* | 11/2005 | Shin | 345/76 |
| 2005/0264493 A1* | 12/2005 | Shin | 345/76 |
| 2005/0264496 A1* | 12/2005 | Shin | 345/76 |
| 2005/0285824 A1* | 12/2005 | Shin | 345/76 |
| 2005/0285827 A1* | 12/2005 | Eom | 345/76 |
| 2006/0022912 A1* | 2/2006 | Park et al. | 345/76 |
| 2006/0107146 A1* | 5/2006 | Kim et al. | 714/727 |
| 2006/0156118 A1* | 7/2006 | Shin | 714/726 |
| 2006/0202940 A1* | 9/2006 | Azami et al. | 345/100 |
| 2006/0291610 A1* | 12/2006 | Lo et al. | 377/64 |
| 2007/0040771 A1* | 2/2007 | Chung et al. | 345/76 |
| 2008/0123799 A1* | 5/2008 | Otose | 377/68 |
| 2008/0211746 A1* | 9/2008 | Caligiore et al. | 345/76 |
| 2008/0273024 A1* | 11/2008 | Koyama | 345/211 |
| 2008/0278425 A1* | 11/2008 | Koyama | 345/92 |

FOREIGN PATENT DOCUMENTS

| | | |
|---|---|---|
| KR | 10-2000-0019417 A | 4/2000 |
| KR | 10-2003-0037608 A | 5/2003 |
| KR | 10-2003-0078013 A | 10/2003 |
| KR | 10-2004-0003298 A | 1/2004 |
| KR | 10-2004-0093504 A | 11/2004 |
| KR | 10-2005-0113683 A | 12/2005 |

OTHER PUBLICATIONS

Korean Patent Abstracts, Publication No. 10-2000-0019417, dated Apr. 6, 2000, in the name of Seung Tae Kim.

Korean Patent Abstracts, Publication No. 10-2003-0037608, dated May 14, 2003, in the name of Jun Seok Yoo.

Korean Patent Abstracts, Publication No. 10-2003-0078013, dated Oct. 4, 2003, in the name of Shinichi Abe.

Korean Patent Abstracts, Publication No. 10-2004-0003298, dated Jan. 13, 2004, in the name of Sun Ha Shin.

Korean Patent Abstracts, Publication No. 10-2004-0093504, dated Nov. 6, 2004, in the name of Han Su Bae.

Korean Patent Abstracts, Publication No. 10-2005-0113683, dated Dec. 5, 2005, in the name of Dong Yong Shin.

* cited by examiner

EMISSION DRIVING DEVICE OF ORGANIC LIGHT EMITTING DISPLAY DEVICE

CROSS-REFERENCE TO RELATED APPLICATION

This application claims priority to and the benefit of Korean Patent Application No. 10-2005-0078923, filed Aug. 26, 2005, in the Korean Intellectual Property Office, the entire content of which is incorporated herein in its entirety by reference.

BACKGROUND OF THE INVENTION

1. Field of the Invention

The present invention relates to an organic light emitting display (OLED) device (or organic electroluminescent display device), and more particularly, to a system on panel (SOP)-type emission driver generating an emission control signal to control emission of pixels arranged in a pixel portion, and an organic light emitting display (OLED) device having the same.

2. Description of the Related Art

When an organic light emitting display (OLED) device is constructed to have a large screen, the dimensions of an OLED display panel for a glass substrate are limited due to fabricating process limitations. Also, if the screen is large, there is a greater probability of a defect occurring somewhere on the screen and thus a reduction in yield is generally unavoidable, and it is difficult to obtain uniformity across the screen.

As a solution to the above problems of the OLED display device, a tiling technique was developed. In the tiling technique, a plurality of OLED display panels are bonded like tiles to form a single panel.

Each of the OLED display panels includes a plurality of pixels to display an image like in a conventional OLED display device. In each of the OLED display panels, a scan driver applies a scan signal to enable the pixels, and a data driver applies a data signal to the selected pixels. Also, an emission driver applies an emission control signal to each of the pixels in order to control the exact programming of the data signal and the time taken for an emission operation.

As described above, the scan driver, the data driver, and the emission driver, which transmit various signals to drive the OLED display panels, can be electrically connected to each of the OLED display panels in various manners.

For example, the scan driver, the data driver, and the emission driver may be mounted as chips on a tape carrier package (TCP) that is bonded and electrically connected to each of the OLED display panels. Alternatively, the drivers may be mounted as chips on a flexible printed circuit (FPC) or a film that is bonded and electrically connected to each of the OLED display panels. The latter technique is referred to as a chip on flexible board (or chip on film) (COF) technique. In another method, the drivers are directly mounted on a glass substrate of the OLED display panel. This method is referred to as a chip on glass (COG) technique.

These methods are costly and complicate modules because the drivers should be separately designed and electrically connected to one another. To overcome these drawbacks, a system on panel (SOP) technique has been developed recently. Also, there have been attempts at designing a pixel portion, scan and emission drivers and/or a data driver in each OLED display panel, in order to construct all systems in the OLED display panels.

In the OLED display device using the tiling technique, when each OLED display panel is formed as an SOP type, it is easy to bond the OLED display panels to one another. Also, the SOP technique enables the area of drivers to be reduced and cost and labor for designing integrated circuits (ICs) of the respective drivers to be saved.

However, in order to develop the SOP-type OLED, it is necessary to consider many internal circumstances and conditions of the OLED display panels, such as a driving frequency and electron mobility of the data driver and/or the scan and emission drivers. Up to present, it is still difficult to design the data driver within a panel because the data driver needs a high driving frequency.

Accordingly, the data driver is formed as an IC using complementary metal oxide semiconductor (CMOS) technology and connected to the OLED display panel, while the scan driver and/or the emission driver are formed within the OLED display panel.

Therefore, there is a need of a simple circuit construction in which an SOP-type scan driver and emission driver can be driven in the OLED display panel.

SUMMARY OF THE INVENTION

The present invention provides an emission driving device, which is designed as a system on panel (SOP) type in an organic light emitting display (OLED) device panel and generates an emission control signal to control the emission time of pixels.

In an embodiment of the present invention, an emission driving device of an OLED display device includes: a first line controller having a plurality of flip-flops that apply emission control signals to a plurality of first emission control lines; and a second line controller having a plurality of flip-flops that apply emission control signals to a plurality of second emission control lines, wherein each of the flip-flops includes: an input portion adapted to receive an input signal, and output a signal at a level in response to a control signal and an inverted control signal; a first inverter adapted to invert the output signal of the input portion; a second inverter adapted to invert an output signal of the first inverter; and an output portion adapted to invert an output signal of the second inverter and output the emission control signal.

In another embodiment of the present invention, an emission driving device includes a plurality of flip-flops that output emission control signals for controlling emission of a plurality of pixels to display an image. Each of the flip-flops includes: a first transistor electrically connected between a first power supply voltage line and a first node, and adapted to be switched according to the level of a control signal applied to a gate terminal of the first transistor; a second transistor electrically connected between the first node and a line of the inverted control signal, and adapted to be switched according to the level of the second node electrically connected to a gate terminal of the second transistor; a third transistor having a first electrode electrically connected to a second node, and adapted to transmit or cut off an input signal applied to a second electrode according to the level of the control signal applied to a gate terminal of the third transistor; a fourth transistor electrically connected between the first power supply voltage line and a third node, having a gate terminal electrically connected the first node, and adapted to be switched according to the level of the first node; a fifth transistor electrically connected between the third node and a second power supply voltage line, having a gate terminal connected to the gate terminal of the first transistor, and adapted to be switched according to the level of the control signal; a sixth transistor electrically connected between the first power supply voltage line and a fourth node, having a gate terminal electrically connected to the third node, and adapted to be switched according to the level of the third node; a seventh transistor electrically connected between the second power supply voltage line and the fourth node, having a gate terminal electrically connected to the gate terminal of the fourth transistor and the first node, and adapted to be switched according to the level of the first node; an eighth transistor electrically connected between the first power supply voltage line and a fifth node, having a gate terminal electrically connected to the fourth node, and adapted to be switched according to the level of the fourth node; and a ninth transistor electrically connected between the second power supply voltage line and the fifth node, having a gate terminal electrically connected in common to the gate terminal of the sixth transistor and the third node, and adapted to be switched according to the level of the third node.

BRIEF DESCRIPTION OF THE DRAWINGS

The above and other features of the present invention will be described in reference to certain exemplary embodiments thereof with reference to the attached drawings in which.

DETAILED DESCRIPTION

The present invention will now be described more fully hereinafter with reference to the accompanying drawings, in which exemplary embodiments of the invention are shown.

Figure 1:
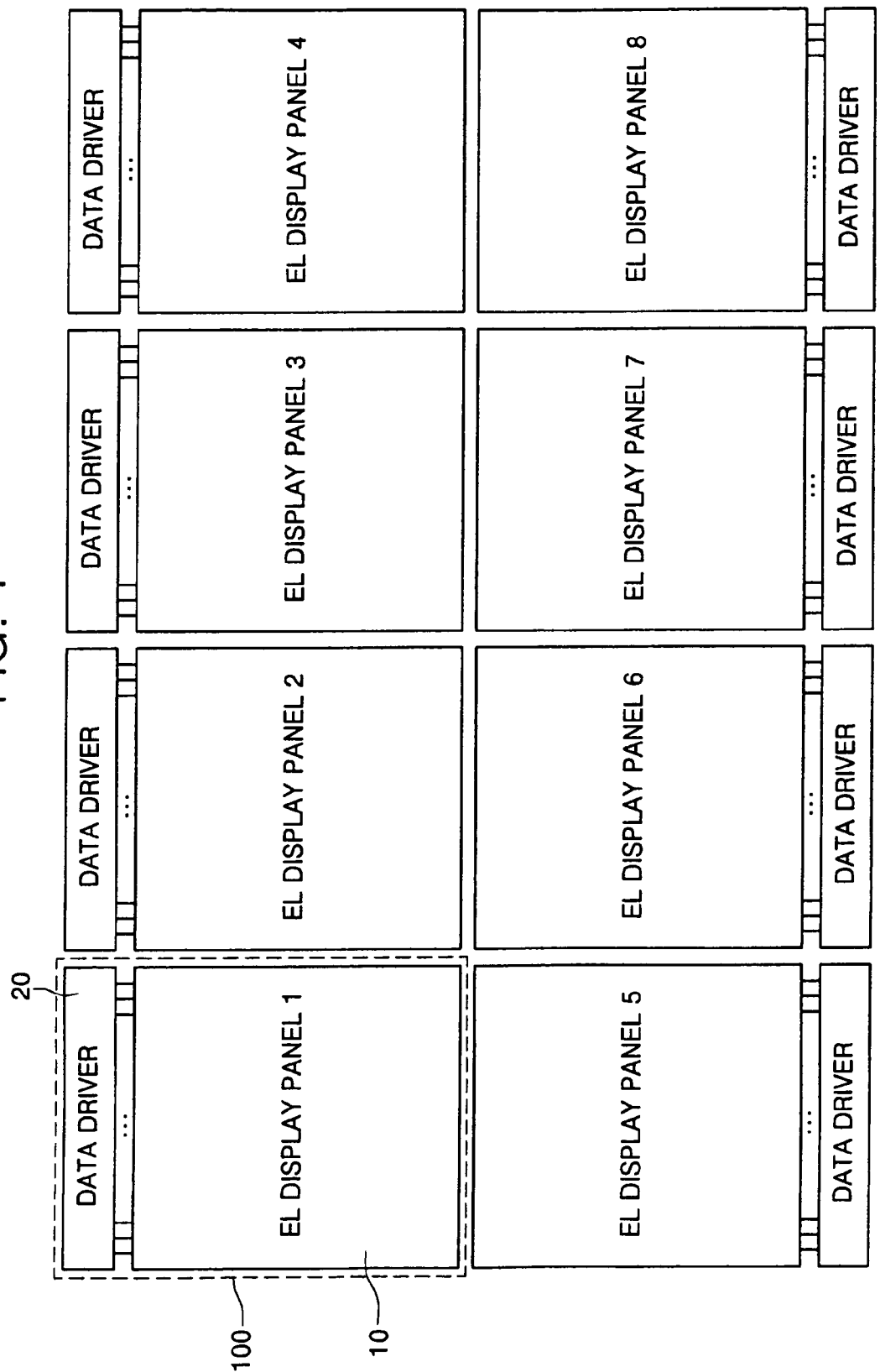
FIG. 1 is a block diagram of an OLED display device using a tiling technique according to an embodiment of the present invention.

FIG. 1 is a block diagram of an OLED display device using a tiling technique according to an exemplary embodiment of the present invention.

Referring to FIG. 1, the OLED display device using the tiling technique is formed by bonding a plurality of sub-OLED display devices 100. In FIG. 1, it is illustrated that 8 sub-OLED display devices 100, which are disposed in four columns and two rows, are bonded to one another. However, the OLED display device of the present invention may be designed to various sizes.

Each of the sub-OLED display devices 100 includes an OLED display panel (or electroluminescent (EL) display panel) 10 for displaying an image, and a data driver 20 for applying a data signal to the OLED display panel 10.

Each of the OLED display panels 10 has substantially the same construction, and one or more edges of each of the OLED display panels 10 are bonded to one another using an adhesive to form a combined OLED display device. The adhesive may be ultraviolet (UV)-curing resin or thermal curing resin. By way of example, but without being limited thereto, the adhesive may be epoxy resin.

Each of the OLED display panels 10 can be produced by the same fabricating process as an OLED display panel for a conventional OLED display device. Accordingly, a large-sized OLED display device can be fabricated by bonding a plurality of OLED display panels that are each obtained through substantially the same fabricating process.

Each of the OLED display panels 10 includes a scan driver, an emission driver, and a plurality of pixels. Additionally, each of the drivers and the pixels includes a thin film transistor (TFT), which has a polysilicon channel, which may be utilized to obtain fast response speed and high uniformity. In this case, a polysilicon layer for the channel may be made by forming an amorphous silicon (a-Si) layer on a glass substrate and crystallizing the a-Si layer using a low temperature polysilicon (LTPS) process.

A plurality of TFTs are formed of the polysilicon layer that is obtained by the LTPS process. Additionally, a pixel portion, a scan driver, and an emission driver are formed of the transistors in each of the OLED display panels 10. The OLED display panel 10 is composed of pixels and generates a signal for control. The pixel portion includes red (R), green (G), and blue (B) sub-pixels, and the scan and emission drivers select respective pixels and generate signals for controlling an emission operation. A detailed description of the OLED display panel 10 will be described later.

Each of the data drivers 20 is designed as an external integrated circuit (IC) using complementary metal oxide semiconductor (CMOS) technology and electrically connected to the corresponding OLED display panel 10. The OLED display panel 10 is electrically connected to the data driver 20 using a metal pattern that is printed on a flexible film. That is, an output terminal of the data driver 20 is electrically connected to one end of the metal pattern, and a data line disposed on the OLED display panel 10 is electrically connected to the other end of the metal pattern. This method is referred to as a tape carrier package (TCP) technique. Each of the data drivers 20 transmits a data signal to the pixel portion of the OLED display panel 10 through a plurality of conductive lines that are disposed on the flexible film.

Figure 2:
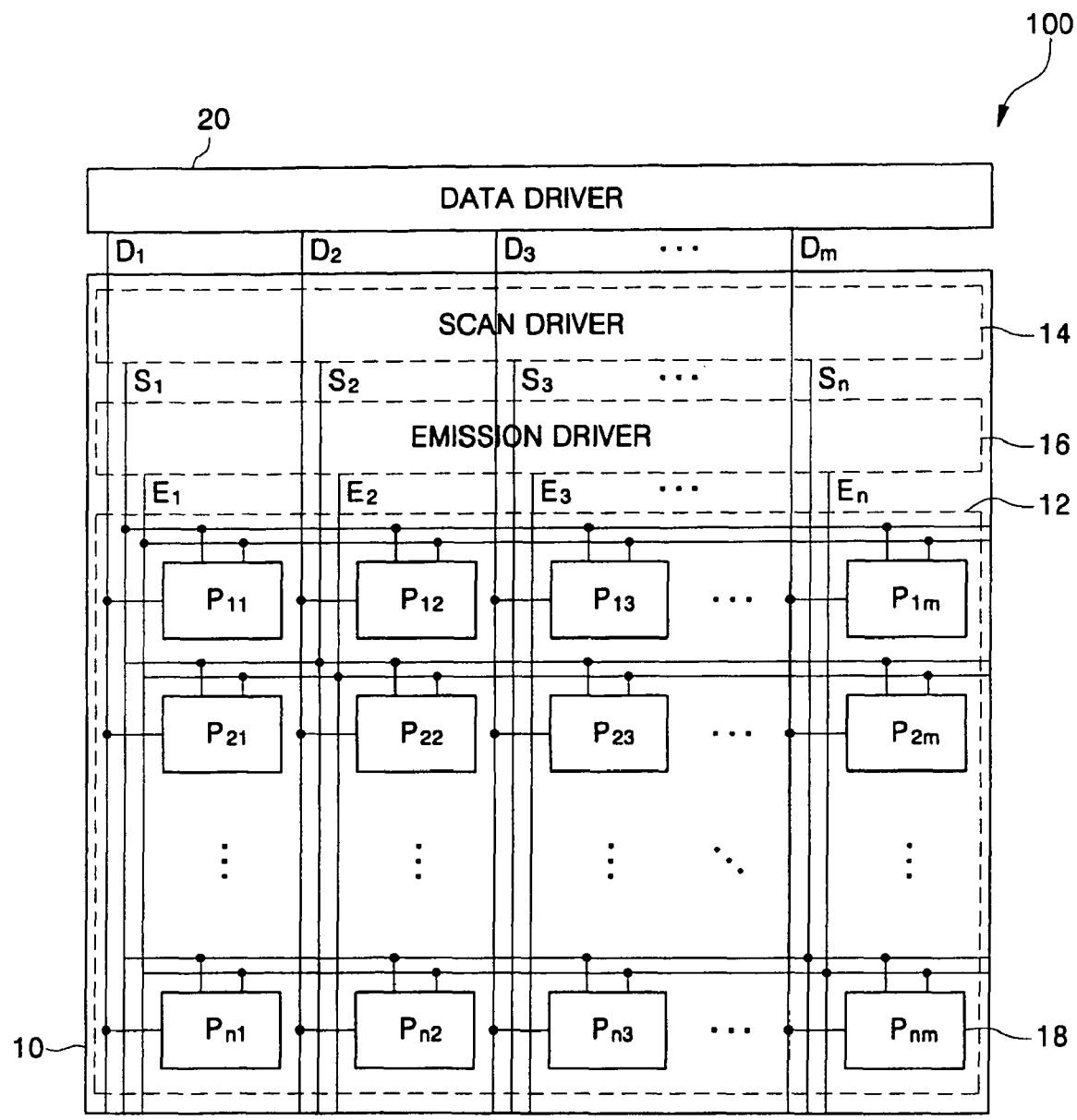
FIG. 2 is a detailed block diagram of a sub-OLED display device shown in FIG. 1.

FIG. 2 is a detailed block diagram of the sub-OLED display device 100 shown in FIG. 1.

Referring to FIG. 2, the sub-OLED display device 100 includes an OLED display panel 10 and a data driver 20.

The OLED display panel 10 includes a pixel portion 12, a scan driver 14, and an emission driver 16.

The pixel portion 12 includes a plurality of data lines D1-Dm, a plurality of scan lines S1-Sn, a plurality of emission control lines E1-En, and a plurality of pixels P11-Pnm that are formed in regions where the data lines D1-Dm, the scan lines S1-Sn, and the emission control lines E1-En cross over one another.

The data lines D1-Dm are electrically connected to the data driver 20. The data lines D1-Dm transmit data signals to the respective pixels P11-Pnm as illustrated in FIG. 2.

Unlike a conventional OLED display device, the scan lines S1-Sn and the emission control lines E1-En extend in the same direction as the data lines D1-Dm. However, each of the scan and emission control lines S1-Sn and E1-En includes contact holes in order to transmit the same scan and emission control signals to pixels arranged in a horizontal direction (i.e., the direction in which the scan and emission control lines extend). Therefore, metal interconnections, which contact the scan and emission control lines S1-Sn and E1-En through the contact holes, extend in a horizontal direction so that the scan and emission control signals are transmitted to the pixels arranged in the horizontal direction.

Each of the pixels P11-Pnm includes R, G, and B sub-pixels that are repeatedly arranged in rows and columns. The R, G, and B sub-pixels include different materials for an organic emission layer that emits light, but are substantially the same in interconnection layout and circuit connection of a driving circuit portion. Accordingly, each of the pixels P11-Pnm emits R, G, or B light with luminance corresponding to a data signal applied thereto and displays a specific color by combining the R, G, and B lights.

The scan driver 14 is disposed between the data driver 20 and the pixel portion 12. Since a large-sized panel is formed by bonding a plurality of OLED display panels 10, the scan driver 14 should be formed on the same side as the data driver 20. This may be referred to as one side driving. The scan driver 14 is connected to one or more scan lines S1-Sn. Thus, the scan driver 14 can sequentially apply scan signals to the pixel portion 12 and can select each of the pixels P11-Pnm.

The emission driver 16 is disposed between the scan driver 14 and the pixel portion 12. The emission driver 16 is connected to one or more emission control lines E1-En. Thus, the emission driver 16 can apply emission control signals to the pixel portion 12 and control an emission time of each of the pixels P11-Pnm.

The data driver 20 applies data signals to the pixel portion 12 of the OLED display panel 10 through one or more conductive lines disposed on the flexible film as described above.

According to the present invention as described above, the sub-OLED display device 100 includes the OLED display panel 10 and the data driver 20, and the OLED display panel 10 includes the pixel portion 12, the scan driver 14, and the emission driver 16.

The structure and operation of the emission driver 16 will now be described in detail with reference to exemplary embodiments of the present invention. Hereinafter, the emission driver will be referred to as an "emission driving device."

Figure 3:
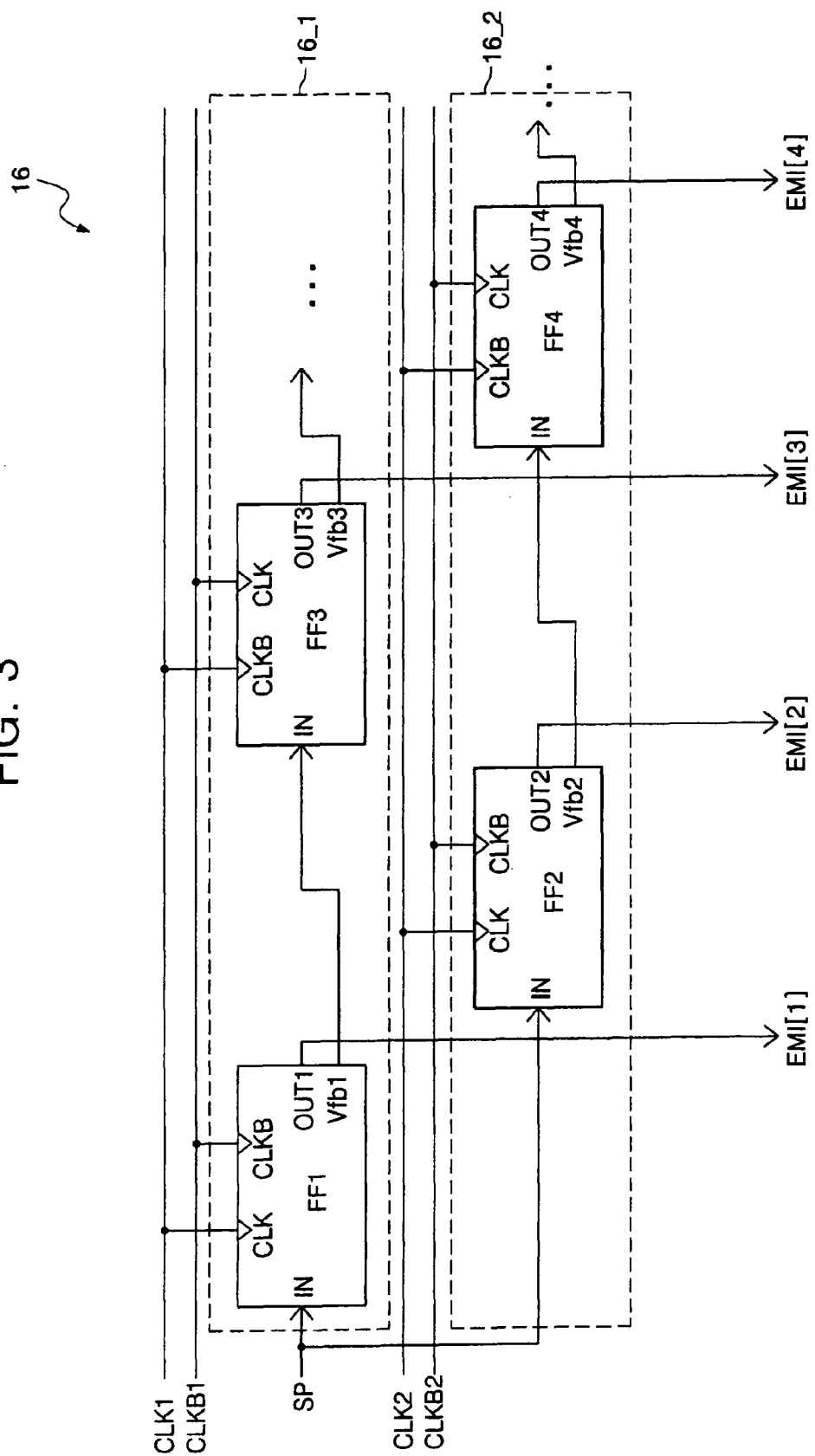
FIG. 3 is a block diagram of an emission driving device of an OLED display device according to an exemplary embodiment of the present invention.
Figure 5:
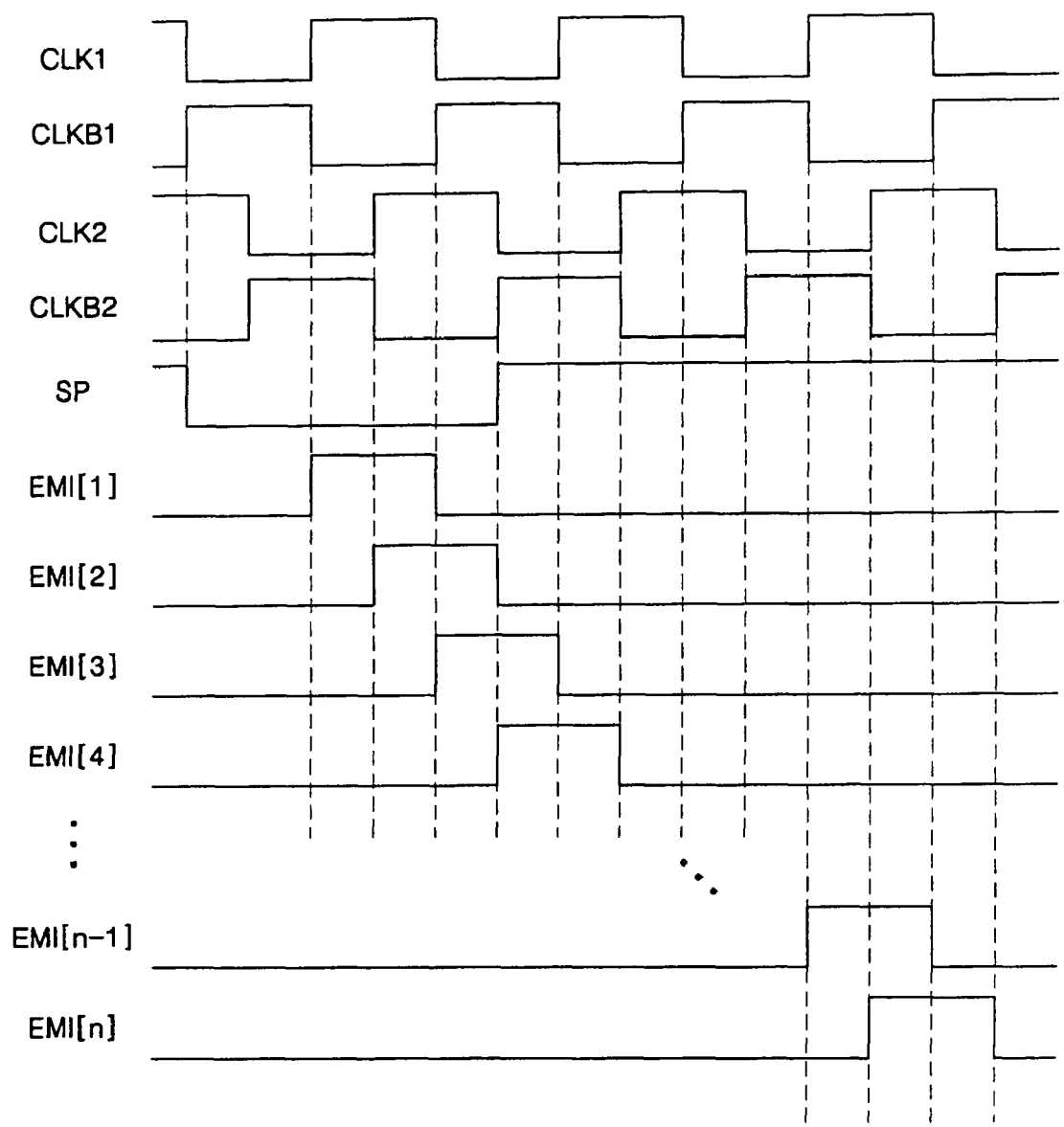
FIG. 5 is a timing diagram illustrating the operation of the emission driving device shown in FIG. 3.

FIG. 3 is a block diagram of an emission driving device of an OLED display device according to an exemplary embodiment of the present invention. FIG. 5 is a timing diagram illustrating the operation of the emission driving device shown in FIG. 3 according to an embodiment of the present invention.

Referring to FIG. 3, the emission driving device 16 according to an exemplary embodiment of the present invention includes a plurality of flip-flops FF1, FF2, FF3, FF4, . . . . The emission driving device 16 includes an odd line controller 16_1 and an even line controller 16_2. The odd line controller 16_1 includes a plurality of flip-flops FF1, FF3, FF5, . . . , which apply emission control signals EMI[1], EMI[3], EMI[5], . . . to odd emission control lines, respectively. The even line controller 16_2 includes a plurality of flip-flops FF2, FF4, FF6, . . . , which apply emission control signals EMI[2], EMI[4], EMI[6], . . . to even emission control lines, respectively.

A first clock signal CLK1 and an inverted first clock signal CLKB1 are alternately applied to each of the flip-flops FF1, FF3, . . . of the odd line controller 16_1. Specifically, the first clock signal CLK1 is applied to a clock input terminal CLK of a first flip-flop FF1 and the inverted first clock signal CLKB1 is applied to an inverted clock input terminal CLKB thereof, whereas the inverted first clock signal CLKB is applied to a clock input terminal CLK of a third flip-flop FF3 and the first clock signal CLK1 is applied to an inverted clock input terminal CLKB thereof.

A second clock signal CLK2 and an inverted second clock signal CLKB2 are alternately applied to each of the flip-flops FF2, FF4, . . . of the even line controller 16_2. Specifically, the second clock signal CLK2 is applied to a clock input terminal CLK of a second flip-flop FF2 and the inverted second clock signal CLKB2 is applied to an inverted clock input terminal CLKB thereof, whereas the inverted second clock signal CLKB2 is applied to a clock input terminal CLK of a fourth flip-flop FF4 and the second clock signal CLK2 is applied to an inverted clock input terminal CLKB thereof.

In the odd line controller 16_1, the first flip-flop FF1 receives a start pulse SP and outputs a first emission control signal EMI[1] in synchronization with the first clock signal CLK1 and the inverted first clock signal CLKB1, as illustrated in FIG. 5. The first emission control signal EMI[1] is used to control the emission of pixels arranged in a first row. Also, the first flip-flop FF1 transmits a first transmission signal Vfb1 to the third flip-flop FF3.

The third flip-flop FF3 receives the first transmission signal Vfb1 from the first flip-flop FF1 and outputs a third emission control signal EMI[3] in synchronization with the inverted first clock signal CLKB1 and the first clock signal CLK1, which are shifted by ½ clock cycle, as illustrated in FIG. 5. The third emission control signal EMI[3] is used to control the emission of pixels arranged in a third row. Also, the third flip-flop FF3 transmits a third transmission signal Vfb3 to a fifth flip-flop FF5 positioned in the next stage as an input signal.

Although the embodiment illustrated in FIG. 3 is that of an odd line controller 16_1 that includes only two flip-flops FF1 and FF3, the present invention is not limited thereto as the odd line controller 16_1 may include other flip-flops having substantially the same construction and in a number equal to the number of emission control lines.

In the even line controller 16_2, the second flip-flop FF2 receives the same start pulse SP as the first flip-flop FF1 and outputs a second emission control signal EMI[2] in synchronization with the second clock signal CLK2, which is shifted by ¼ clock cycle behind the first clock signal CLK1 as illustrated in FIG. 5, and the inverted clock signal CLKB2. The second emission control signal EMI[2] is used to control the emission of pixels arranged in a second row. Also, the second flip-flop FF2 transmits a second transmission signal Vfb2 to the fourth flip-flop FF4 positioned in the next stage.

The fourth flip-flop FF4 receives the second transmission signal Vfb2 from the second flip-flop FF2 and outputs a fourth emission control signal EMI[4] in synchronization with the inverted second clock signal CLKB2 and the second clock signal CLK2, which are shifted by ½ clock cycle as illustrated in FIG. 5. Also, the fourth flip-flop FF4 transmits a fourth transmission signal Vfb4 to a sixth flip-flop FF6 positioned in the next stage.

Although the embodiment illustrated in FIG. 3 is that of an even line controller 16_2 that includes only two flip-flops FF2 and FF4, the present invention is not limited thereto as the even line controller 16_2 may include other flip-flops having substantially the same construction and in a number equal to the number of emission control lines.

As the flip-flops FF1, FF2, FF3, FF4 have the above-described construction, the emission control signals EMI[1], EMI[2], EMI[3], . . . have the same duty as the clock signals CLK1, CLK2, CLK3, . . . and are shifted by ¼ clock cycle and output.

Hereinafter, the circuit construction of each of the flip-flops will be described with reference to FIG. 4.

Figure 4:
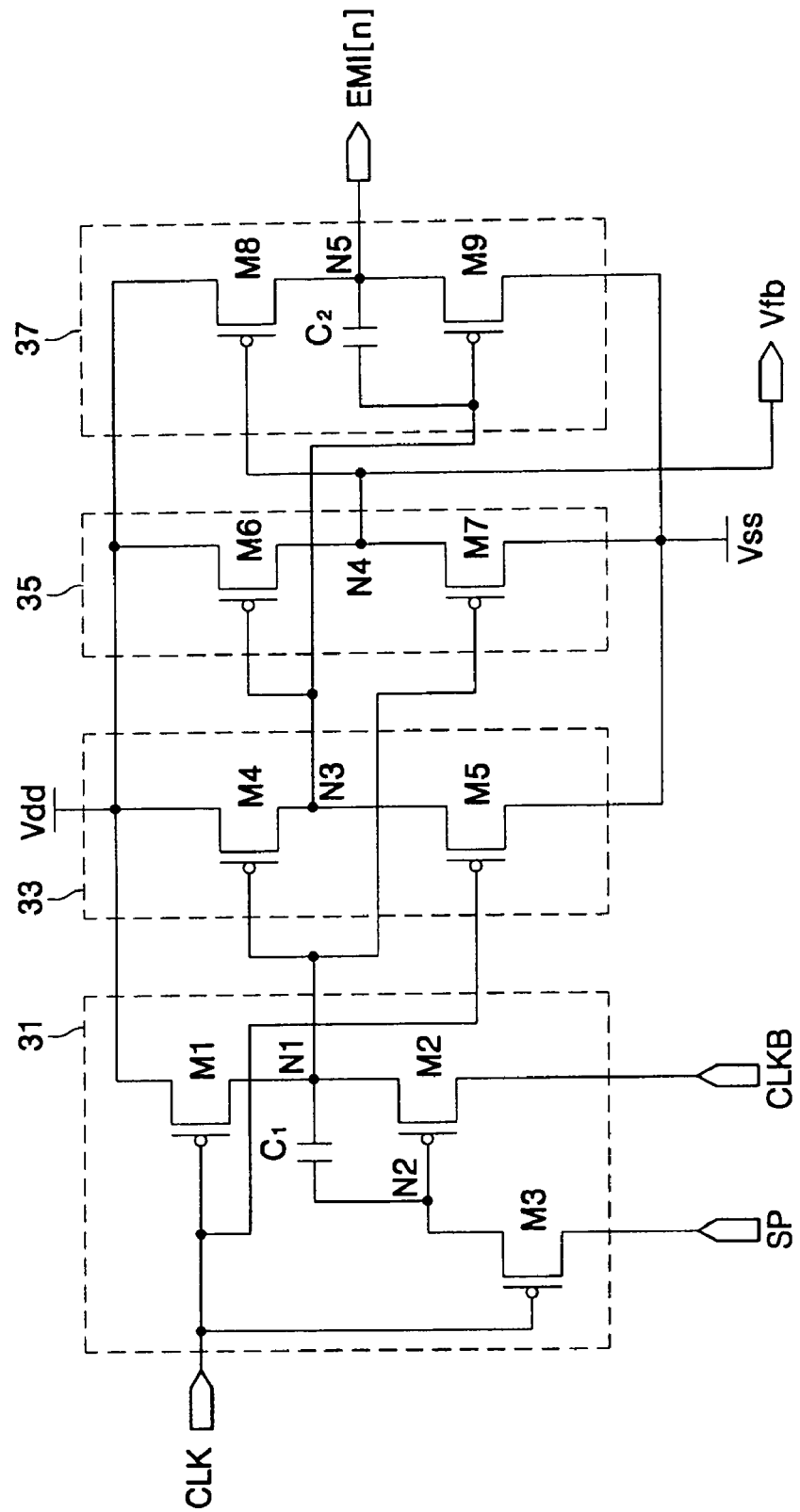
FIG. 4 is a circuit diagram of a flip-flop shown in FIG. 3.

FIG. 4 is a circuit diagram of one of the flip-flops shown in FIG. 3.

In FIG. 4, the odd-numbered flip-flop FF1 of the odd line controller 16_1 or the odd-numbered flip-flop FF2 of the even line controller 16_2 will be taken as an example. Both of the flip-flops have substantially the same circuit construction. Also, the first clock signal CLK1 or the second clock signal CLK2 applied to the clock input terminal CLK will be referred to as a clock signal CLK, and the inverted first clock signal CLKB1 or the inverted second clock signal CLKB2 applied to the inverted clock input terminal CLKB will be referred to as an inverted clock signal CLKB.

Referring to FIG. 4, the flip-flop according to an embodiment of the present invention includes an input portion 31, a first inverter 33, a second inverter 35, and an output portion 37.

The input portion 31 receives a start pulse SP, a clock signal CLK, and an inverted clock signal CLKB and outputs a voltage at the same level as the inverted clock signal CLKB. The flip-flop in the next stage receives a transmission signal Vfb output from the flip-flop in the previous stage as an input signal as described above with reference to FIG. 3.

More specifically, the input portion 31 includes three transistors M1, M2, and M3 and one capacitor C1.

The first transistor M1 is connected between a positive power supply voltage line Vdd and a node N1, and the clock signal CLK is input to a gate terminal of the first transistor M1.

The second transistor M2 has a first electrode connected to the node N1, and a gate terminal connected to a node N2. Also, the inverted clock signal CLKB is input to a second electrode of the second transistor M2.

The third transistor M3 has a first electrode connected to the node N2. The start pulse SP is input to a second electrode of the third transistor M3, and the clock signal CLK is input to a gate terminal thereof. Here, the start pulse SP is applied to the second electrode of the third transistor M3 when the flip-flop is the first flip-flop FF1 or the second flip-flop FF2, whereas the transmission signal Vfb of the previous flip-flop is input to the second electrode of the third transistor M3 when the flip-flop is one of the other flip flops FF3, FF4, . . .

Here, the first through third transistors M1, M2, and M3 are p-type metal oxide semiconductor field effect transistors (MOSFETs), but the present invention is not limited thereto, as, for example, the input portion 31 can alternately be designed using n-type MOSFETs by those skilled in the art.

The capacitor C1 is connected between the nodes N1 and N2 and maintains a voltage between source and gate terminals of the second transistor M2. The capacitor C1 allows the flip-flop to have pull down operation and generally leads the flip-flop to be in the same full-swing as a driving voltage.

The operation of the input portion 31 will now be described. When the clock signal CLK is at a low level, the inverted clock signal CLKB is at a high level, and the start pulse SP is at a low level, both the first and third transistors M1 and M3 are turned on. Thus, a low-level start pulse SP is input to the gate terminal of the second transistor M2, so that the second transistor M2 is turned on. However, because the high-level inverted clock signal CLKB is applied to the second electrode of the second transistor M2, no current flows through the second transistor M2. Thus, a high-level signal is output through a scan line connected to the node N1. In this case, since the inverted clock signal CLKB is transitioned to a high level, a voltage difference between the source and the drain of the second transistor M2 becomes 0 V, and thus static current is completely cut off from the second transistor M2.

Next, when the clock signal CLK is at a high level, the inverted clock signal CLKB is at a low level, and the start pulse SP is at a low level, both the first and third transistors M1 and M3 are turned off. However, since the node N2 is floated at a low level, the second transistor M2 remains turned on. Accordingly, the low-level inverted clock signal CLKB is applied to the second electrode of the second transistor M2 as shown in FIG. 4, and the second transistor M2 allows current to flow. As the current flows through the second transistor M2 due to a high-level voltage stored in the node N1, the voltage at the node N1 drops as much as the low-level inverted clock signal CLKB. This is because as the third transistor M3 is turned off, the node N2 connected to one terminal of the capacitor C1 is floated, and thus the voltage at the node N2 drops as much as the voltage at the node N1 so that it can be pulled down. As a result, a low-level signal is output through the node N1.

The first inverter 33, which is also a component of the flip-flop, inverts an output signal of the input portion 31 and outputs the inverted signal. Specifically, the first inverter 33 includes two transistors M4 and M5. The fourth transistor M4 is connected between the positive power supply voltage line Vdd and a node N3. Also, a gate terminal of the fourth transistor M4 is connected to the node N1, which is an output terminal of the input portion 31. Thus, when the output signal of the input portion 31 is at a low level, the fourth transistor M4 is turned on and outputs a positive power supply voltage, and when the output signal of the input portion 31 is at a high level, the fourth transistor M4 is turned off and cut offs the positive power supply voltage.

The fifth transistor M5 is connected between the node N3 and a negative power supply voltage line Vss. Also, a gate terminal of the fifth transistor M5 is connected to the gate terminal of the first transistor M1 of the input portion 31. Thus, the fifth transistor M5 is turned on or off and outputs or cuts off a negative power supply voltage depending on whether the clock signal CLK input to the gate terminal of the fifth transistor M5 is at a low level or high level. An output terminal of the first inverter 33 is the node N3.

The operation of the first inverter 33 will now be described. When the output signal of the input portion 31 is at a high level, the clock signal CLK is at a low level. In this case, the fourth transistor M4 is turned off, and the fifth transistor M5 is turned on. Accordingly, a negative power supply voltage is output.

Next, when the output signal of the input portion 31 is at a low level, the clock signal CLK is at a high level. In this case, the fourth transistor M4 is turned on, and the fifth transistor M5 is turned off. Accordingly, a positive power supply voltage is output.

The fourth and fifth transistors M4 and M5 are p-type MOSFETs, but the present invention is not limited thereto, as the first inverter 33 can alternately be designed using, for example, n-type MOSFETs by those skilled in the art.

The second inverter 35, which is another component of the flip-flop, inverts an output signal of the first inverter 33 and outputs the inverted signal. Specifically, the second inverter 35 includes two transistors M6 and M7. The sixth transistor M6 is connected between the positive power supply voltage line Vdd and a node N4. Also, a gate terminal of the sixth transistor M6 is connected to the node N3, which is the output terminal of the first inverter 33. Thus, when the output signal of the first inverter 33 is at a low level, the sixth transistor M6 is turned on and outputs a positive power supply voltage, and when the output signal of the first inverter 33 is at a high level, the sixth transistor M6 is turned off and cuts off the positive power supply voltage.

The seventh transistor M7 is connected between the node N4 and the negative power supply voltage line Vss. A gate terminal of the seventh transistor M7 is connected in common to the gate terminal of the fourth transistor M4 of the first inverter 33 and the node N1 of the input portion 31. Thus, the seventh transistor M7 is turned on or off and outputs or cuts off the negative power supply voltage depending on whether the output signal of the input portion 31 is at a low level or high level. An output terminal of the second inverter 35 is the node N4.

A signal output from the node N4 which is the output terminal of the second inverter 35 is the transmission signal Vfb as described above with reference to FIG. 3. The transmission signal Vfb is input to the next stage flip-flop.

The operation of the second inverter 35 will now be described. When the output signal of the first inverter 33 is at a high level, the output signal of the input portion 31 is at a low level. In this case, the sixth transistor M6 is turned off, and the seventh transistor M7 is turned on. Accordingly, a negative power supply voltage is output.

Next, when the output signal of the first inverter 33 is at a low level, the output signal of the input portion 31 is at a high level. In this case, the sixth transistor M6 is turned on, and the seventh transistor M7 is turned off. Accordingly, a positive power supply voltage is output.

The sixth and seventh transistors M6 and M7 are p-type MOSFETs, but the present invention is not limited thereto, as the second inverter 35 can alternately be designed, for example, using n-type MOSFETs by those skilled in the art.

Finally, the output portion 37, which is yet another component of the flip-flop, inverts an output signal of the second inverter 35 and outputs the inverted signal. Specifically, the output portion 37 includes two transistors M8 and M9 and one capacitor C2. The eighth transistor M8 is connected between the positive power supply voltage line Vdd and a node N5. Also, a gate terminal of the eighth transistor M8 is connected to the node N4, which is the output terminal of the second inverter 35. Thus, when the output signal of the second inverter 35 is at a low level, the eighth transistor M8 is turned on and outputs the positive power supply voltage, and when the output signal of the second inverter 35 is at a high level, the eighth transistor M8 is turned off and cuts off the positive power supply voltage.

The ninth transistor M9 is connected between the node N5 and the negative power supply voltage line Vss. A gate terminal of the ninth transistor M9 is connected in common to the gate terminal of the sixth transistor M6 of the second inverter 35 and the node N3 of the first inverter 33. Thus, the ninth transistor M9 is turned on or off and outputs or cuts off the negative power supply voltage depending on whether the output signal of the first inverter 33 is at a low level or high level. An emission control signal EMI[n] is output from the node N5 of the output portion 37 and transmitted to pixels arranged in an n-th row.

The second capacitor C2 is connected between the nodes N5 and N3 and maintains a voltage between a source and a gate of the ninth transistor M9 for a duration of time, which may be predetermined.

The operation of the output portion 37 will now be described. When the output signal of the second inverter 35 is at a high level, the output signal of the first inverter 33 is at a low level. In this case, the eighth transistor M8 is turned off, and the ninth transistor M9 is turned on. Accordingly, the emission control signal EMI[n] has a negative power supply voltage.

Next, when the output signal of the second inverter 35 is at a low level, the output signal of the first inverter 33 is at a high level. In this case, the eighth transistor M8 is turned on, and the ninth transistor M9 is turned off. Accordingly, the emission control signal EMI[n] has a positive power supply voltage.

The eighth and ninth transistors M8 and M9 are p-type MOSFETs, but the present invention is not limited thereto, as the output portion 37 can alternately be designed, for example, using n-type MOSFETs by those skilled in the art.

With reference to FIG. 4, the first flip-flop FF1 or the second flip-flop FF2 was described as an example. An even-numbered flip-flop FF3 of the odd line controller 16_1 or an even-numbered flip-flop FF4 of the even line controller 16_2 has substantially the same circuit construction as in FIG. 4 except that the inverted first clock signal CLKB1 or the inverted second clock signal CLKB2 is applied to the clock input terminal CLK, and the first clock signal CLK1 or the second clock signal CLK2 is applied to the inverted clock input terminal CLKB. Further, the transmission signal Vfb is input to the flip-flop instead of the input signal SP since the circuit construction and operation of the third flip-flop FF3 or the fourth flip-flop FF4 are easily understood by those skilled in the art with reference to FIG. 4, a description thereof will be omitted here.

FIG. 5 is a timing diagram illustrating the operation of the emission driving device shown in FIG. 3 according to an embodiment of the present invention.

Referring to FIGS. 3 through 5, first, the first flip-flop FF1 of the odd line controller 16_1 will be described.

The first flip-flop FF1 receives a low-level first clock signal CLK1, a high-level inverted first clock signal CLKB1, and a low-level start pulse SP. In this case, all the first, second, and third transistors M1, M2, and M3 of the input portion 31 are turned on. Thus, a high-level signal is output from the node N1. In this case, the second transistor M2 is turned on, but a voltage difference between the source and drain becomes 0 V owing to the high-level inverted first clock signal CLKB1 applied to the second electrode of the second transistor M2, so that the flow of static current is substantially cut off. As a result, power dissipation caused by the static current is reduced.

In response to the high-level signal output from the input portion 31 and the low-level first clock signal CLK1, the fourth transistor M4 of the first inverter 33 is turned off, and the fifth transistor M5 is turned on. Thus, the first inverter 33 outputs a low-level signal.

Once the second inverter 35 receives the low-level signal output from the first inverter 33 and the high-level signal output from the input portion 31, the sixth transistor M6 of the second inverter 35 is turned on, and the seventh transistor M7 thereof is turned off. Thus, the second inverter 35 outputs a high-level signal. The high-level signal Vfb1 is input to the third flip-flop FF3 positioned in the next stage.

Once the output portion 37 receives the high-level signal output from the second inverter 35 and the low-level signal output from the first inverter 33, the eighth transistor M8 of the output portion 37 is turned off, and the ninth transistor M9 thereof is turned on. Accordingly, a low-level first emission control signal EMI[1] is finally output.

Next, the first clock signal CLK1 is shifted by ½ a clock cycle, so that the input portion 31 of the first flip-flop FF1 receives a high-level first clock signal CLK1, a low-level inverted first clock signal CLKB1, and a low-level start pulse SP. Thus, both the first and third transistors M1 and M3 are turned off. In this case, one terminal of the capacitor C1 connected to the node N2 is floated. While the second transistor M2 is turned on, it allows current to flow due to a source-gate voltage difference and a source-drain voltage difference. Accordingly, the voltage at the node N1 drops as much as the low-level inverted first clock signal CLKB1, and thus the node N1 outputs a low-level signal.

In response to the low-level signal output from the input portion 31 and the high-level first clock signal CLK1, the fourth transistor M4 of the first inverter 33 is turned on, and the fifth transistor M5 thereof is turned off. Thus, the first inverter 33 outputs a high-level signal.

Once the second inverter 35 receives the high-level signal output from the first inverter 33 and the low-level signal output from the input portion 31, the sixth transistor M6 of the second inverter 35 is turned off, and the seventh transistor M7 thereof is turned on. Thus, the second inverter 35 outputs a low-level signal. The low-level signal Vfb1 is input to the third flip-flop FF3 positioned in the next stage.

Once the output portion 37 receives the low-level signal output from the second inverter 35 and the high-level signal output from the first inverter 33, the eighth transistor M8 of the output portion 37 is turned on, and the ninth transistor M9 thereof is turned off. Thus, a high-level first emission control signal EMI[1] is finally output.

Next, the first clock signal CLK1 is shifted by ½ clock cycle, and thus the input portion 31 of the first flip-flop FF1 receives a low-level first clock signal CLK1, a high-level inverted first clock signal CLKB1, and a start pulse SP that is transitioned from a low level to a high level. In this case, since the start pulse SP makes the low-to-high transition, the second transistor M2 is turned off, and the input portion 31 outputs a high-level signal. Finally, the output portion 37 outputs a low-level first emission control signal EMI[1] through the first and second inverters 33 and 35.

In subsequent cycles, the first clock signal CLK1 and the inverted first clock signal CLKB1 change to a low level and a high level, but the start pulse SP is clamped at a high level. Therefore, the first emission control signal EMI[1] remains at a low level.

Hereinafter, the operation of the third flip-flop FF3 of the odd line controller 16_1 will be described.

The input portion 31 of the third flip-flop FF3 receives a low-level inverted first clock signal CLKB1 and a high-level first clock signal CLK1, which are shifted by ½ clock cycle, and a low-level input signal, which is the output signal Vfb of the second inverter 35 of the first flip-flip FF1. Here, a description of the third flip-flip FF3 will be omitted because it performs substantially the same operation as the first flip-flop FF1. Accordingly, the third flip-flop FF3 finally outputs a low-level third emission control signal EMI[3].

Next, the first clock signal CLK1 is shifted by ½ clock cycle, and thus the input portion 31 of the third flip-flop FF3 receives a high-level inverted first clock signal CLKB1, a low-level first clock signal CLK1, and a high-level input signal Vfb. Accordingly, the input portion 31 outputs a low-level signal, and the first inverter 33 inverts the low-level signal output from the input portion 31 and outputs a high-level signal. Also, the second inverter 35 inverts the high-level signal output from the first inverter 33 and outputs a low-level signal. The output portion 37 receives the low-level signal from the second inverter 35 and finally outputs a high-level third emission control signal EMI[3].

Next, the first clock signal CLK1 is shifted by ½ clock cycle, and thus the input portion 31 of the third flip-flop FF3 receives a low-level inverted first clock signal CLKB1, a high-level first clock signal CLK1, and a high-level input signal Vfb1. In this case, the second transistor M2 is turned off due to the high-level input signal Vfb1, so that the input portion 31 outputs a high-level signal. Accordingly, the output portion 37 finally outputs a low-level third emission control signal EMI[3] through the first and second inverters 33 and 35.

In subsequent cycles, the first clock signal CLK1 and the inverted first clock signal CLKB1 change to a low level and a high level, but the input signal Vfb1 is clamped at a high level. Therefore, the third emission control signal EMI[3] remains at a low level.

Thereafter, a fifth flip-flop FF5, a seventh flip-flop FF7, . . . of the odd line controller 16_1 repeat substantially the same operation as the first and third flip-flops FF1 and FF3 and output shifted emission control signals at intervals of ½ a cycle of the first clock signal CLK1.

As described above, the odd line controller 16_1 shifts the emission control signals EMI[1], EMI[3], . . . at intervals of ½ cycle of the first clock signal CLK1 and sequentially outputs the shifted emission control signals to odd lines.

The even line controller 16_2 repeats substantially the same operation as the odd line controller 16_1 and applies the emission control signals EMI[2], EMI[4], . . . to even lines. However, the second clock signal CLK2 and the inverted second clock signal CLKB2, which are applied to the even line controller 16_2, are shifted by ¼ clock cycle behind the first clock signal CLK1 and the inverted first clock signal CLKB1 and applied to each of the flip-flops FF2, FF4, FF6, . . .

The flop-flops FF2, FF4, FF6, . . . of the even line controller 16_2 will be briefly described. The second flip-flop FF2 receives a low-level second clock signal CLK2, a high-level inverted second clock signal CLKB2, and a low-level start pulse SP and outputs a low-level second emission control signal EMI[2]. Also, the second flip-flop FF2 receives a high-level second clock signal CLK2 and a low-level inverted second clock signal CLKB2, which are shifted by ½ clock cycle, and a low-level start pulse SP and outputs a high-level second emission control signal EMI[2].

The fourth flip-flop FF4 receives a low-level inverted second clock signal CLKB2 and a high-level second clock signal CLK2, which are shifted by ½ clock cycle, and a low-level input signal Vfb2 output from the second inverter 35 of the second flip-flop FF2 and outputs a low-level fourth emission control signal EMI[4]. Also, the fourth flip-flop FF4 receives a high-level inverted second clock signal CLKB2 and a low-level second clock signal CLK2, which are shifted by ½ clock cycle, and a high-level input signal Vfb2 output from the second inverter 35 of the second flip-flop FF2 and outputs a high-level fourth emission control signal EMI[4].

As described above, in this embodiment, the even line controller 16_2 shifts the emission control signals EMI[2], EMI[4], . . . at intervals of ½ cycle of the second clock signal CLK1 and sequentially outputs the shifted emission control signals to the even lines.

As described above, the emission driving device according to the exemplary embodiment of the present invention makes use of nine p-type MOS transistors M1 to M9 and two capacitors C1 and C2 so that emission control signals are shifted by ¼ cycle relative to a clock signal CLK and sequentially output.

Also, when the input portion 31 outputs a high-level signal, the flow of static current is cut off owing to the high-level signal applied to a drain terminal of the second transistor M2, and thus power consumption can be reduced. Furthermore, the capacitor C1 is connected between a source and a gate of the second transistor M2 so that when a low-level signal is output, a sufficient pull down is enabled. Also, the emission driving device outputs signals at intervals of ½ clock cycle and thus has high operating speed.

According to the present invention as described above, a plurality of flip-flips, each of which includes a number of transistors and a number of capacitors, are directly formed in a display panel, so that the display panel can be realized using a system on panel (SOP)-type technique. In the described embodiment, each flip-flop contains nine transistors and two capacitors.

Also, the flow of static current is cut off, thus reducing power consumption.

Further, by connecting a capacitor between a source and a gate of a second transistor, a low-level signal can be output in the same waveform as a driving voltage so that a sufficient pull down is enabled.

In addition, since the emission driving device outputs signals at intervals of ½ clock cycle, operating speed may be improved.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An emission driving device of an organic light emitting display device, the emission driving device comprising:
   a first line controller having a first plurality of flip-flops of a plurality of flip-flops for applying first emission control signals of a plurality of emission control signals to a first plurality of emission control lines; and
   a second line controller having a second plurality of flip-flops of the plurality of flip-flops for applying second emission control signals of the plurality of emission control signals to a second plurality of emission control lines,
   wherein each flip-flop of the plurality of flip-flops includes:
      an input portion adapted to receive an input signal, and output an output signal at a level in response to a control signal and an inverted control signal;
      a first inverter adapted to invert the output signal of the input portion and output the inverted output signal of the input portion as an output signal of the first inverter;
      a second inverter adapted to invert the output signal of the first inverter in response to the output signal of the first inverter and output this inverted output signal of the first inverter as an output signal of the second inverter; and
      an output portion adapted to invert the output signal of the second inverter in response to the output signal of the second inverter and output a respective one of the emission control signals,
   wherein the input portion comprises:
      a first transistor electrically connected between a first power supply voltage line and a first node, and adapted to be switched according to a level of the control signal applied to a gate terminal of the first transistor;
      a second transistor electrically connected between the first node and a line of the inverted control signal, and adapted to be switched according to a level of a second node connected to a gate terminal of the second transistor; and
      a third transistor having a first electrode connected to the second node, and adapted to transmit or cut off the input signal applied to a second electrode according to the level of the control signal applied to a gate terminal of the third transistor, and
   wherein the first inverter comprises:
      a fourth transistor electrically connected between the first power supply voltage line and a third node, having a gate terminal connected to the first node of the input portion, and adapted to be switched according to a level of the first node; and
      a fifth transistor electrically connected between a second power supply voltage line and the third node, having a gate terminal connected to the gate terminal of the first transistor, and adapted to be switched according to the level of the control signal.

2. The emission driving device according to claim 1, wherein the input portion further comprises a first capacitor electrically connected between a source and the gate terminal of the second transistor,
   wherein the first capacitor is adapted to maintain a voltage between the source and the gate terminal of the second transistor for a duration of time.

3. The emission driving device according to claim 2, wherein
   the control signal and the inverted control signal applied to the first line controller are a first clock signal and an inverted first clock signal, respectively,
   the control signal and the inverted control signal applied to the second line controller are a second clock signal and an inverted second clock signal, respectively, and
   the second clock signal and the inverted second clock signal are shifted by ¼ cycle relative to the first clock signal and the inverted first clock signal, respectively, and applied to the second line controller.

4. The emission driving device according to claim 3, wherein
   the first clock signal is applied to a clock input terminal of a flip-flop of the first plurality of flip-flops, and the inverted first clock signal is applied to an inverted clock input terminal of the flip-flop of the first plurality of flip-flops, and
   the second clock signal is applied to a clock input terminal of a flip-flop of the second plurality of flip-flops, and the inverted second clock signal is applied to an inverted clock input terminal of the flip-flop of the second plurality of flip-flops.

5. The emission driving device according to claim 4, wherein the second inverter comprises:
   a sixth transistor electrically connected between the first power supply voltage line and a fourth node, having a gate terminal connected to the third node of the first inverter, and adapted to be switched according to a level of the third node; and
   a seventh transistor electrically connected between the second power supply voltage line and the fourth node, having a gate terminal connected to the gate terminal of the fourth transistor and the first node of the input portion, and adapted to be switched according to the level of the first node.

6. The emission driving device according to claim 5, wherein the output portion comprises:
   an eighth transistor electrically connected between the first power supply voltage line and a fifth node, having a gate terminal electrically connected to the fourth node of the second inverter, and adapted to be switched according to a level of the fourth node; and
   a ninth transistor electrically connected between the second power supply voltage line and the fifth node, having a gate terminal electrically connected to the gate terminal of the sixth transistor and the third node of the first inverter, and adapted to be switched according to the level of the third node.

7. The emission driving device according to claim 6, wherein the output portion further comprises a second capacitor electrically connected between a source and the gate terminal of the ninth transistor,
   wherein the second capacitor is adapted to maintain a voltage between the source and the gate terminal of the ninth transistor for a duration of time.

8. The emission driving device according to claim 7, wherein each of the first and second plurality of flip-flops is configured to:
   output the respective one of the emission control signals through the fifth node of the output portion, and
   transmit an input signal through the fourth node of the second inverter to a respective flip-flop of the first and second plurality of flip-flops of a subsequent stage.

9. The emission driving device according to claim 8, wherein the first, second, third, fourth, fifth, sixth, seventh, eighth and ninth transistors constitute the input portion, the first inverter, the second inverter, and the output portion, and are PMOS transistors.

10. The emission driving device according to claim 1, wherein the first line controller and the second line controller are an odd line controller and an even line controller, respectively.

11. The emission driving device according to claim 1, wherein the first plurality of flip-flops apply the first emission control signals sequentially and the second plurality of flip-flops apply the second emission control signals sequentially.

12. An emission driving device comprising a plurality of flip-flops adapted to output emission control signals to control emission of a plurality of pixels to display an image, wherein each of the plurality of flip-flops comprises:
   a first transistor electrically connected between a first power supply voltage line and a first node, and adapted to be switched according to a level of a control signal applied to a gate terminal of the first transistor;
   a second transistor electrically connected between the first node and an inverted control signal line, and adapted to be switched according to a level of a second node electrically connected to a gate terminal of the second transistor;
   a third transistor having a first electrode electrically connected to the second node, and adapted to transmit or cut off an input signal applied to a second electrode according to the level of the control signal applied to a gate terminal of the third transistor;
   a fourth transistor electrically connected between the first power supply voltage line and a third node, having a gate terminal connected to the first node, and adapted to be switched according to a level of the first node;
   a fifth transistor electrically connected between the third node and a second power supply voltage line, having a gate terminal electrically connected to the gate terminal of the first transistor, and adapted to be switched according to the level of the control signal;
   a sixth transistor electrically connected between the first power supply voltage line and a fourth node, having a gate terminal electrically connected to the third node, and adapted to be switched according to a level of the third node;
   a seventh transistor electrically connected between the second power supply voltage line and the fourth node, having a gate terminal connected to the gate terminal of the fourth transistor and the first node, and adapted to be switched according to the level of the first node;
   an eighth transistor electrically connected between the first power supply voltage line and a fifth node, having a gate terminal connected to the fourth node, and adapted to be switched according to a level of the fourth node; and
   a ninth transistor electrically connected between the second power supply voltage line and the fifth node, having a gate terminal connected to the gate terminal of the sixth transistor and the third node, and adapted to be switched according to the level of the third node.

13. The emission driving device according to claim 12, further comprising:
   a first capacitor electrically connected between a source and the gate terminal of the second transistor, wherein the first capacitor is adapted to maintain a voltage between the source and the gate terminal of the second transistor for a duration of time; and
   a second capacitor electrically connected between a source and the gate terminal of the ninth transistor, wherein the second capacitor is adapted to maintain a voltage between the source and the gate terminal of the ninth transistor for a duration of time.

14. The emission driving device according to claim 13, wherein the first, second, third, fourth, fifth, sixth, seventh, eighth and ninth transistors are PMOS transistors.

* * * * *